US012354903B2

(12) United States Patent
Baek et al.

(10) Patent No.: US 12,354,903 B2
(45) Date of Patent: Jul. 8, 2025

(54) DEPOSITION APPARATUS AND DISPLAY PANEL MANUFACTURING APPARATUS INCLUDING THE SAME

(71) Applicant: Samsung Display Co., Ltd., Yongin-Si (KR)

(72) Inventors: Gyungmin Baek, Yongin-si (KR); Hyunah Sung, Suwon-si (KR); Hyuneok Shin, Gwacheon-si (KR); Namwook Kang, Hwaseong-si (KR); Dooseon Yu, Cheonan-si (KR); You Jong Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 295 days.

(21) Appl. No.: 17/402,923

(22) Filed: Aug. 16, 2021

(65) Prior Publication Data

US 2022/0181196 A1 Jun. 9, 2022

(30) Foreign Application Priority Data

Dec. 9, 2020 (KR) .................. 10-2020-0171107

(51) Int. Cl.
*H01L 21/687* (2006.01)
*C23C 14/50* (2006.01)
*H01L 21/683* (2006.01)

(52) U.S. Cl.
CPC ........ *H01L 21/68785* (2013.01); *C23C 14/50* (2013.01); *H01L 21/6833* (2013.01)

(58) Field of Classification Search
None
See application file for complete search history.

(56) References Cited

U.S. PATENT DOCUMENTS

| 6,794,664 | B1 * | 9/2004 | Mitchell | ............. | H01L 21/6831 |
| | | | | | 250/492.2 |
| 6,898,064 | B1 * | 5/2005 | Berman | ............. | H01L 21/6831 |
| | | | | | 361/233 |
| 8,325,457 | B2 | 12/2012 | Park et al. | | |
| 10,403,536 | B2 | 9/2019 | Yang et al. | | |

(Continued)

FOREIGN PATENT DOCUMENTS

| CN | 1890776 A | 1/2007 |
| CN | 1897243 A | 1/2007 |

(Continued)

*Primary Examiner* — Jeffrie R Lund
*Assistant Examiner* — Tiffany Z Nuckols
(74) *Attorney, Agent, or Firm* — CANTOR COLBURN LLP

(57) ABSTRACT

A deposition apparatus includes: a susceptor provided with a plurality of susceptor holes defined therein; an electrostatic chuck disposed on the susceptor and provided with a plurality of electrostatic chuck holes defined therein; and a plurality of pins penetrating through the susceptor and the electrostatic chuck to connect the susceptor and the electrostatic chuck. Each of the pins includes a first portion disposed in a corresponding electrostatic chuck hole of the plurality of electrostatic chuck holes and a second portion disposed in a corresponding susceptor hole of the plurality of susceptor holes. The first portion includes a first base portion and a first cooler disposed in the first base portion.

19 Claims, 10 Drawing Sheets

(56) References Cited

U.S. PATENT DOCUMENTS

| | | | | |
|---|---|---|---|---|
| 2003/0168439 A1* | 9/2003 | Kanno | ................ | H01L 21/6831 |
| | | | | 414/217 |
| 2009/0258142 A1* | 10/2009 | An | ........................ | C23C 14/042 |
| | | | | 427/255.6 |
| 2010/0193130 A1* | 8/2010 | Kawakami | .......... | H01L 21/6831 |
| | | | | 156/345.37 |
| 2014/0251956 A1* | 9/2014 | Jeon | .................. | H01J 37/32706 |
| | | | | 156/345.44 |
| 2018/0190529 A1* | 7/2018 | Takebayashi | ..... | H01J 37/32724 |
| 2019/0371578 A1* | 12/2019 | Larosa | .............. | H01L 21/68785 |

FOREIGN PATENT DOCUMENTS

| | | | |
|---|---|---|---|
| CN | 108028221 | A | 5/2018 |
| CN | 110556316 | A | 12/2019 |
| KR | 1020080061109 | A | 7/2008 |
| KR | 100964619 | B1 | 6/2010 |
| KR | 101001454 | B1 | 12/2010 |
| KR | 101652852 | B1 | 9/2016 |
| KR | 1020170039781 | A | 4/2017 |

\* cited by examiner

DEPOSITION APPARATUS AND DISPLAY PANEL MANUFACTURING APPARATUS INCLUDING THE SAME

This application claims priority to Korean Patent Application No. 10-2020-0171107, filed on Dec. 9, 2020, and all the benefits accruing therefrom under 35 U.S.C. § 119, the content of which in its entirety is herein incorporated by reference.

BACKGROUND

1. Field of Disclosure

The present disclosure relates to a deposition apparatus and a display panel manufacturing apparatus including the same. More particularly, the present disclosure relates to a deposition apparatus capable of preventing defects such as stains from occurring when manufacturing a thin film and a display panel manufacturing apparatus including the deposition apparatus.

2. Description of the Related Art

An electronic device, such as a smartphone, a tablet computer, a notebook computer, a smart television, or the like, is increasingly developed. The electronic device includes a display device to provide information. Various processes, such as a deposition process to form a thin film on a substrate using a predetermined material, a photolithography process to exposure a selected portion of the thin film, and a dry or wet etch process to pattern the exposed portion of the thin film, are repeatedly performed several times to manufacture the display device. Among the processes, the thin film deposition process, the dry etch process, and the like are carried out in a process chamber that is sealed, and various devices, such as an electrostatic chuck to hold the substrate, a cooler to control a process temperature, and the like, are provided in the process chamber.

SUMMARY

The present disclosure provides a deposition apparatus capable of reducing a temperature unevenness of a surface on which a substrate is chucked.

The present disclosure provides a display panel manufacturing apparatus including the deposition apparatus.

Embodiments of the inventive concept provide a deposition apparatus including: a susceptor provided with a plurality of susceptor holes defined therein, an electrostatic chuck disposed on the susceptor and provided with a plurality of electrostatic chuck holes defined therein; and a plurality of pins penetrating through the susceptor and the electrostatic chuck to connect the susceptor and the electrostatic chuck. Each of the pins includes a first portion disposed in a corresponding electrostatic chuck hole of the plurality of electrostatic chuck holes and a second portion disposed in a corresponding susceptor hole of the plurality of susceptor holes. The first portion includes a first base portion and a first cooler disposed in the first base portion.

The second portion may include a second base portion and a second cooler disposed in the second base portion.

The electrostatic chuck may include a chuck body, a first insulating layer disposed on the chuck body, a plurality of electrodes disposed on the first insulating layer, and a second insulating layer disposed on the electrodes.

The first portion may further include a plurality of pin insulating layers and a plurality of pin electrodes disposed between the pin insulating layers.

The pin electrodes may be independently driven from the electrodes of the electrostatic chuck.

The second portion may include a ceramic material or a metal material.

The deposition apparatus may further include a plate disposed under the susceptor and spaced apart from the electrostatic chuck with the susceptor interposed therebetween, and the pins are protruded from an upper surface of the plate.

The plate may include a plate cooler disposed in the plate.

The deposition apparatus may further include a driver disposed under the plate to change an angle of the plate, the susceptor, and the electrostatic chuck.

The susceptor may include a susceptor body and a heater disposed in the susceptor body.

The electrostatic chuck may include an electrostatic chuck base portion and an electrostatic chuck cooler disposed in the electrostatic chuck base portion.

The first cooler and the electrostatic cooler may be independently driven from each other.

The first cooler may include a cooling line and a refrigerant which circulates through the cooling line.

Embodiments of the inventive concept provide a deposition apparatus including: a plate including a plurality of pins protruding toward an upper direction; a susceptor disposed on the plate and penetrated by the pins; and an electrostatic chuck disposed on the susceptor and penetrated by the pins. Each of the pins includes a first base portion and a first cooler disposed in the first base portion. The first base portion includes a plurality of pin insulating layers and a plurality of pin electrodes disposed between the pin insulating layers.

The first base portion and the first cooler may overlap the electrostatic chuck in a direction crossing the upper direction.

The electrostatic chuck may be provided with electrostatic chuck holes defined therein, the pins may be disposed in the electrostatic chuck holes, and the first base portion and the first cooler may be disposed in the electrostatic chuck holes.

Embodiments of the inventive concept provide a display panel manufacturing apparatus including: a chamber; a deposition head disposed in the chamber and which sprays a deposition material; and a support member disposed under the deposition head and which supports a target substrate. The support member includes: a susceptor provided with a plurality of susceptor holes defined therein; an electrostatic chuck disposed on the susceptor and provided with a plurality of electrostatic chuck holes defined therein; and a plurality of pins penetrating through the susceptor and the electrostatic chuck to connect the susceptor and the electrostatic chuck. Each of the pins includes: a first portion disposed in a corresponding electrostatic chuck hole of the plurality of electrostatic chuck holes and a second portion disposed in a corresponding susceptor holes of the plurality of susceptor holes. The first portion includes a first base portion and a first cooler disposed in the first base portion.

The display panel manufacturing apparatus may further include a mask disposed between the support member and the deposition head.

The target substrate may be disposed on and supported by the electrostatic chuck, and the support member may further include a driver to control the target substrate to be inclined while being chucked at a predetermined angle.

The support member may further include a plate disposed under the susceptor and spaced apart from the electrostatic chuck with the susceptor interposed therebetween, and the pins may be protruded from an upper surface of the plate.

According to the above, the deposition apparatus includes a cooler in an upper portion of a pin inserted through the holes defined in the electrostatic chuck in addition to a cooler defined in the electrostatic chuck to which the substrate is chucked. Accordingly, unevenness in temperature of the surface of the substrate that is chucked is reduced and stains caused by the unevenness in temperature are effectively prevented from occurring in a thin film formed by the deposition apparatus. Thus, reliability of the display panel is effectively improved.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
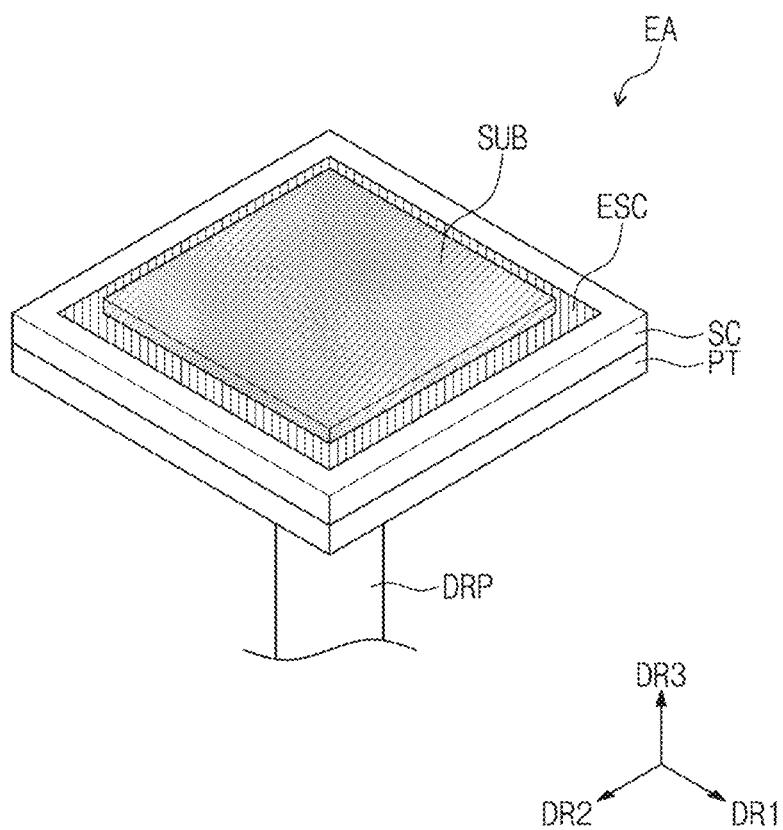
FIG. 1 is a perspective view showing a deposition apparatus according to an embodiment of the present disclosure.

Hereinafter, the present disclosure will be explained in detail with reference to the accompanying drawings. In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Hereinafter, a deposition apparatus and a display panel manufacturing apparatus including the deposition apparatus will be explained in detail with reference to the accompanying drawings.

Figure 2:
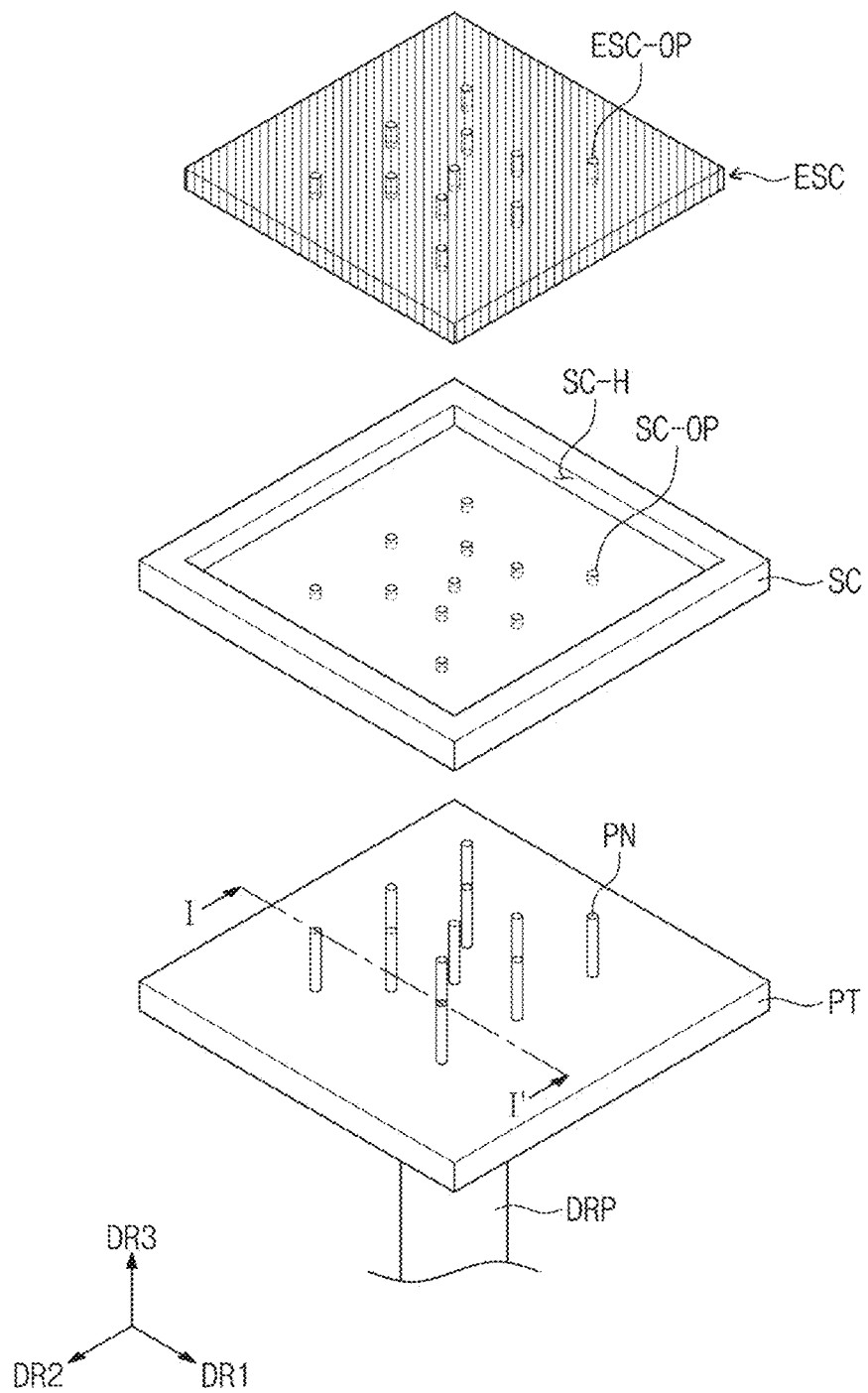
FIG. 2 is an exploded perspective view showing a deposition apparatus according to an embodiment of the present disclosure.

FIG. 1 is a perspective view showing a deposition apparatus EA according to an embodiment of the present disclosure. FIG. 2 is an exploded perspective view showing the deposition apparatus according to an embodiment of the present disclosure.

Referring to FIGS. 1 and 2, the deposition apparatus EA may include a plate PT, a susceptor SC disposed on the plate PT, and an electrostatic chuck ESC disposed on the susceptor SC. The electrostatic chuck ESC may be buried in a predetermined space SC-H defined in the susceptor SC. The electrostatic chuck ESC may be buried in the predetermined space SC-H defined in an upper portion of the susceptor SC and may be spaced apart from the plate PT with the susceptor SC interposed therebetween.

The electrostatic chuck ESC may form an electrostatic force using an electrostatic induction phenomenon and may chuck or dechuck a substrate SUB in a deposition process.

The electrostatic chuck ESC may repeatedly perform a process of chucking the substrate SUB to process the substrate SUB and a process of dechucking the substrate SUB after the processing of the substrate SUB to carry out a next process.

The electrostatic chuck ESC may chuck the substrate SUB disposed on the electrostatic chuck ESC. However, the invention should not be limited thereto or thereby. That is, the electrostatic chuck ESC may chuck the substrate SUB in various directions, such as a direction opposite to a gravity direction or a vertical direction. The substrate SUB may be disposed to be processed while a pixel definition layer PDL (See FIG. 11) is facing upward. For example, a deposition source including a deposition material may be disposed on the electrostatic chuck ESC.

The deposition material may be, for example, a light emitting material that forms a light emitting layer. However, the deposition material according to the invention should not be particularly limited as long as it may be deposited through a deposition process such as a sputtering process. For example, the deposition material may be a metal material used to form an electrode or an organic or inorganic material used to form an insulating layer.

The susceptor SC may have a configuration to control a temperature of the electrostatic chuck ESC disposed therein and to place the electrostatic chuck ESC and the substrate SUB chucked to the electrostatic chuck ESC in various angles. The electrostatic chuck ESC may be disposed on the susceptor SC. In more detail, the electrostatic chuck ESC may be disposed in a predetermined space SC-H defined in an upper surface of the susceptor SC.

A heater may be disposed in a body of the susceptor SC to control the temperature of the substrate SUB in the deposition process. As another way, a flow path for refrigerant may be provided in the susceptor SC to control the temperature of the substrate SUB or a flow path that supplies a backside gas, for example, helium gas, may be provided to efficiently transfer heat of the susceptor SC to the substrate. The helium gas may be transmitted to an interface between the electrostatic chuck ESC and substrate SUB via the flow path provided in the susceptor SC.

The susceptor SC may include or be made of a metal material. For example, the susceptor SC may include aluminum.

The plate PT may be disposed under the susceptor SC and may include a plurality of pins PN protruding from an upper surface of a body of the plate PT. The body of the plate PT may support the susceptor SC and the electrostatic chuck ESC. The plate PT may include or be made of, for example, a ceramic or metal material.

Each of the susceptor SC and the electrostatic chuck ESC may be provided with through-holes defined therethrough and may be disposed to allow the pins PN of the plate PT to pass through the through-holes defined through each of the susceptor SC and the electrostatic chuck ESC. The through-holes may be defined to correspond to the pins PN. FIG. 2 shows eleven pins PN arranged to pass through the susceptor SC and the electrostatic chuck ESC, however, the arrangement and the number of the pins PN may be changed depending on a size and a shape of the substrate SUB that is a target substrate in the deposition process.

The susceptor SC may be provided with a plurality of susceptor holes SC—OP defined therethrough, and the electrostatic chuck ESC may be provided with a plurality of electrostatic chuck holes ESC-OP defined therethrough. At least a portion of each of the pins PN protruded from the plate PT may protrude above an upper surface of the electrostatic chuck ESC after passing through the susceptor holes SC—OP defined through the susceptor SC and the electrostatic chuck holes ESC-OP defined through the electrostatic chuck ESC. Accordingly, the substrate SUB before the deposition process may be supported by the pins PN, and the substrate SUB may be disposed on the electrostatic chuck ESC as the pins PN descend. Then, when the deposition process for the substrate SUB is finished, the pins PN may ascend, and thus, the substrate SUB may be separated from the electrostatic chuck ESC and transferred to an outside of the process chamber. That is, the pins PN may be used to load or unload the substrate SUB.

FIGS. 3A to 3D are perspective views showing the substrate SUB and the deposition apparatus according to an embodiment of the present disclosure.

Referring to FIGS. 1 and 3A to 3D, the deposition apparatus EA may dispose the substrate SUB on the upper surface of the electrostatic chuck ESC, and then, may chuck the substrate SUB in various directions by an operation of a driver DRP. The driver DRP may be connected to a lower portion of the plate PT and may change an angle of the plate PT, the susceptor SC, and the electrostatic chuck ESC. Due to an operation of the driver DRP, a direction of the upper surface of the electrostatic chuck ESC and a direction of the substrate SUB chucked to the electrostatic chuck ESC may be changed.

Figure 3A:
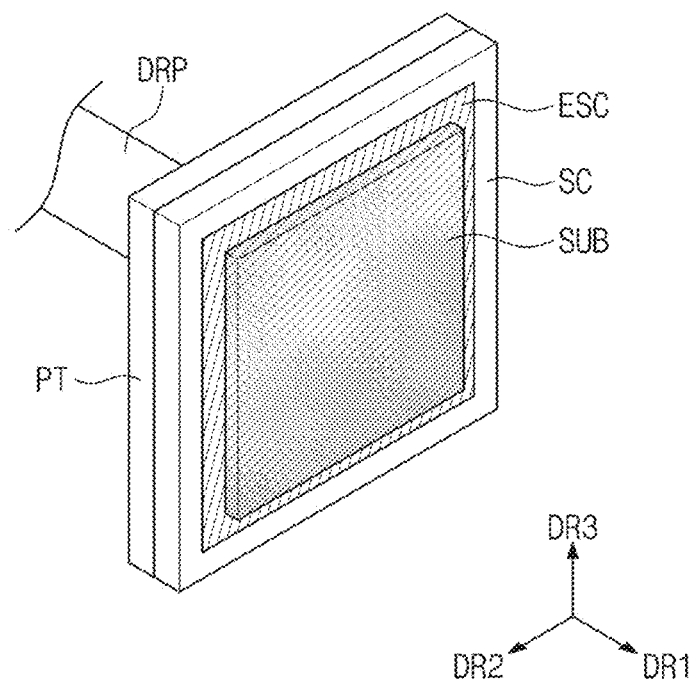
FIGS. 3A to 3D are perspective views showing a substrate and a deposition apparatus according to an embodiment of the present disclosure.

Referring to FIGS. 1 and 3A, the deposition apparatus EA may chuck the substrate SUB such that an upper surface of the substrate SUB faces a first direction DR1. The substrate SUB may be disposed to allow the upper surface thereof to face the first direction DR1 and may be processed in the deposition process.

Figure 3B:
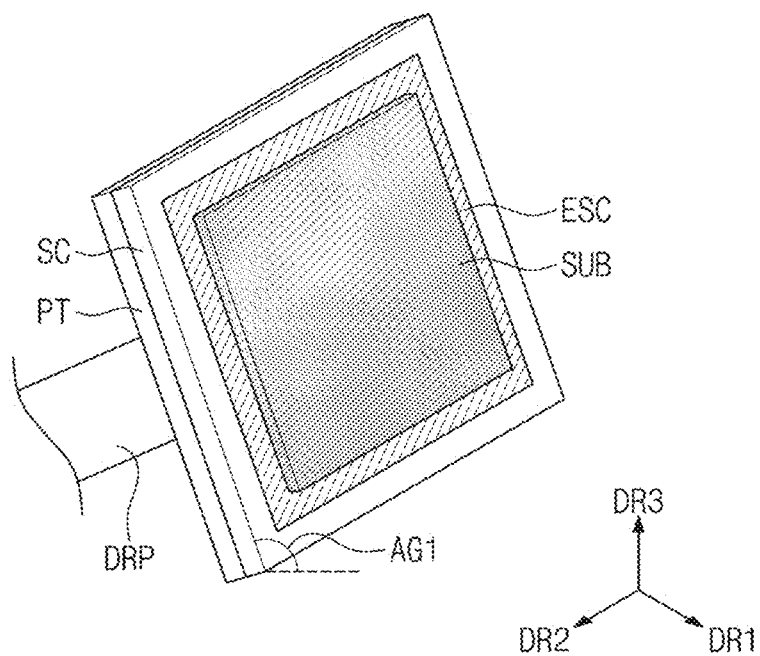
Figure 3C:
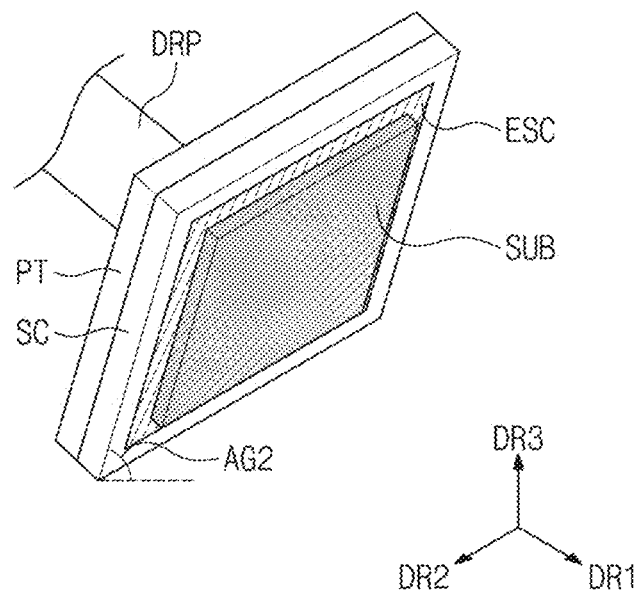

Referring to FIGS. 1, 3B, and 3C, the deposition apparatus EA may chuck the substrate SUB such that the substrate SUB is inclined at predetermined angles AG1 and AG2. For example, the deposition apparatus EA may chuck the substrate SUB such that the substrate SUB is inclined at a first angle AG1 as shown in FIG. 3B. The first angle AG1 may be an angle between a plane defined by the first direction DR1 and a second direction DR2 and a surface of the electrostatic chuck ESC, which makes contact with the substrate SUB. The first angle AG1 may be an obtuse angle. The substrate SUB may be chucked by the electrostatic chuck ESC and may be processed while being inclined at the first angle AG1.

According to an embodiment, the deposition apparatus EA may chuck the substrate SUB such that the substrate SUB is inclined at a second angle AG2 as shown in FIG. 3C. The second angle AG2 may be an angle between the plane defined by the first direction DR1 and the second direction DR2 and the surface of the electrostatic chuck ESC, which makes contact with the substrate SUB. The second angle AG2 may be an acute angle. The substrate SUB may be chucked by the electrostatic chuck ESC and may be processed while being inclined at the second angle AG2.

Figure 3D:
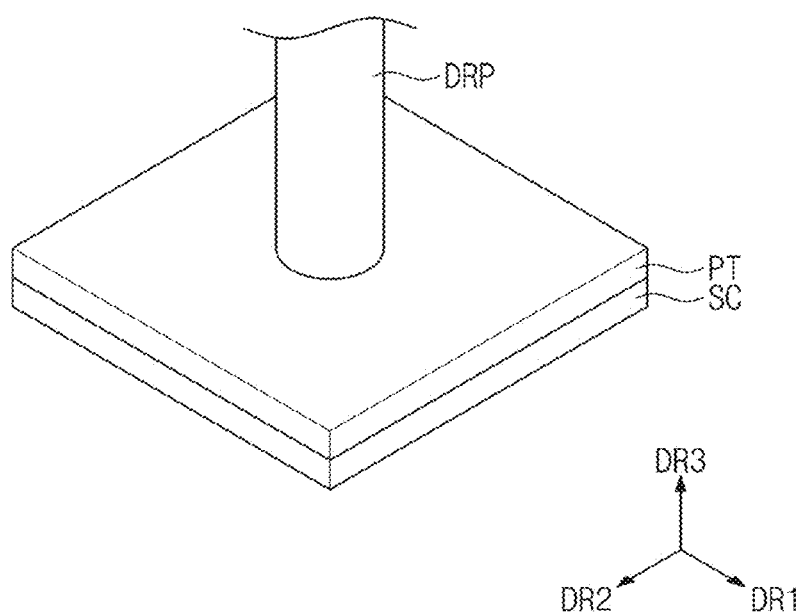

As another way, the deposition apparatus EA may chuck the substrate SUB in the direction opposite to the gravity direction as shown in FIG. 3D. The deposition apparatus EA may chuck the substrate SUB such that the upper surface of the substrate SUB is facing downward. The substrate SUB may be processed in the deposition process after being chucked by the electrostatic chuck ESC and disposed to allow the upper surface of the substrate SUB to face a direction opposite to a third direction DR3.

Figure 4:
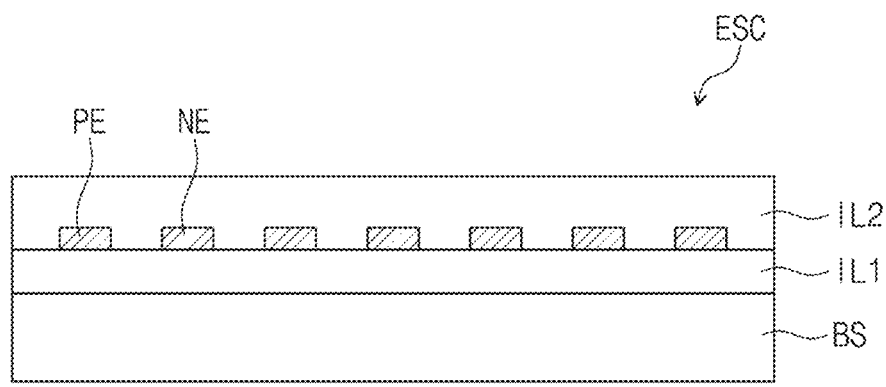
FIG. 4 is a cross-sectional view showing an electrostatic chuck according to an embodiment of the present disclosure.
Figure 4:
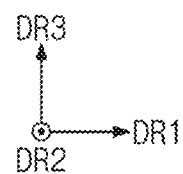

FIG. 4 is a cross-sectional view showing the electrostatic chuck ESC according to an embodiment of the present disclosure.

Referring to FIG. 4, the electrostatic chuck ESC may include a chuck body BS, a first insulating layer ILL a second insulating layer IL2, a plurality of positive electrodes PE, and a plurality of negative electrodes NE.

The chuck body BS may include or be made of a material having a predetermined strength and may serve as a base frame of the electrostatic chuck ESC. The chuck body BS may include or be made of a ceramic material. However, this is merely one example, and the material for the chuck body BS according to the invention should not be limited thereto or thereby. In another embodiment, as an example, the chuck body BS may include or be made of aluminum (Al), titanium (Ti), stainless steel, alumina ($Al_2O_3$), yttrium oxide ($Y_2O_3$), or aluminum nitride. FIG. 4 shows a structure in which the chuck body BS is disposed under the first insulating layer IL1, however, the invention should not be limited thereto or thereby. As another example, the chuck body BS may be disposed on the second insulating layer IL2. The chuck body BS may provide a base surface on which the substrate SUB (refer to FIG. 1) is disposed.

The first insulating layer IL1 may be disposed on the chuck body BS. The first insulating layer IL1 may include or be made of a material having higher heat resistance and higher chemical stability than the materials of the second insulating layer IL2. For example, the first insulating layer IL1 may include yttrium oxide ($Y_2O_3$), however, this is merely one example. That is, the material for the first insulating layer IL1 according to the invention should not be limited thereto or thereby and may include or be made of a variety of materials with the heat resistance and chemical stability.

The first insulating layer IL1 may have a thickness smaller than a thickness of the chuck body BS in the third direction DR3. The thickness of the first insulating layer IL1 may be within a range from about 80 micrometers (µm) to about 100 µm. The thickness of the chuck body BS may be within a range from about 10 mm to about 20 mm.

The second insulating layer IL2 may be disposed on the first insulating layer IL1. The second insulating layer IL2 may include or be made of a material having higher thermal conductivity and higher dielectric characteristics than those of the first insulating layer IL1. For example, the second insulating layer IL2 may include or be made of alumina ($Al_2O_3$), however, this is merely one example. That is, the material for the second insulating layer IL2 according to the invention should not be limited thereto or thereby, and the second insulating layer IL2 may include or be made of a variety of materials having the thermal conductivity.

The second insulating layer IL2 may have a thickness greater than the thickness of the first insulating layer IL1 in the third direction DR3. The thickness of the second insulating layer IL2 may be smaller than the thickness of the chuck body BS. The thickness of the second insulating layer IL2 may be within a range from about 110 µm to about 150 µm.

The electrodes PE and NE may be disposed between the first insulating layer IL1 and the second insulating layer IL2. The electrodes PE and NE may include the positive electrodes PE and the negative electrodes NE. The positive electrodes PE and the negative electrodes NE may be disposed between the first insulating layer IL1 and the second insulating layer IL2. The second insulating layer IL2 may cover the positive electrodes PE and the negative electrodes NE. The positive electrodes PE and the negative electrodes NE may have different polarities from each other. The positive electrodes PE may be alternately arranged with the negative electrodes NE.

Each of the positive electrodes PE and the negative electrodes NE may include or be made of tungsten (W). However, this is merely one example, and a material for the positive electrodes PE and a material for the negative electrodes NE should not be limited thereto or thereby. For example, each of the positive electrodes PE and the negative electrodes NE may include or be made of silver (Ag) or copper (Cu).

Each of the positive electrodes PE and the negative electrodes NE may have the same thickness. The thickness of each of the positive electrodes PE and the negative electrodes NE may be smaller than each thickness of the first insulating layer IL1 and the second insulating layer IL2. The thickness of each of the positive electrodes PE and the negative electrodes NE may be within a range from about 25 µm to about 35 µm.

A positive direct-current voltage may be applied to the positive electrodes PE. A first electrostatic force may be generated between the positive electrodes PE and the substrate SUB. A negative direct-current voltage may be applied to the negative electrodes NE. A second electrostatic force may be generated between the negative electrodes NE and the substrate SUB. According to an embodiment, the electrostatic chuck ESC may be a bipolar electrostatic chuck, however, this is merely one example, and the electrostatic chuck ESC should not be limited thereto or thereby. For example, the electrostatic chuck ESC may be a monopolar electrostatic chuck in another embodiment. In this case, a direct-current voltage applied to the positive electrodes PE of the electrostatic chuck ESC and a direct-current voltage applied to the negative electrodes NE of the electrostatic chuck ESC may have the same polarity as each other.

In a case where the positive direct-current voltage is applied to the positive electrodes PE, upper portions in a first area of the substrate SUB, which overlap the positive electrodes PE, respectively, when viewed in a plane (i.e., in a plan view), may be charged with a negative potential. The electrostatic force may be generated between the positive electrodes PE and the first area due to electric charges.

In a case where the negative direct-current voltage is applied to the negative electrodes NE, upper portions in a second area of the substrate SUB, which overlap the negative electrodes NE, respectively, when viewed in a plane, may be charged with a positive potential. The electrostatic force may be generated between the negative electrodes NE and the second area due to electric charges.

Figure 5:
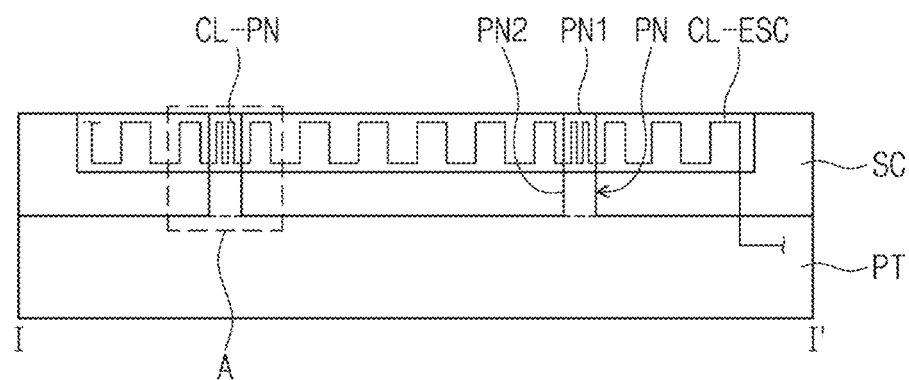
FIG. 5 is a cross-sectional view showing a deposition apparatus according to an embodiment of the present disclosure.
Figure 6:
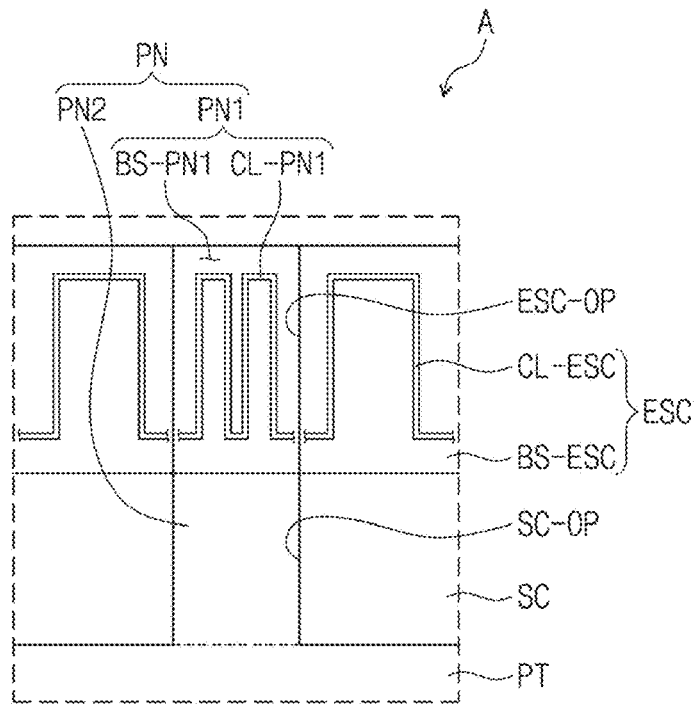
FIGS. 6 and 7 are cross-sectional views showing a portion of a deposition apparatus according to embodiments of the present disclosure.
Figure 7:
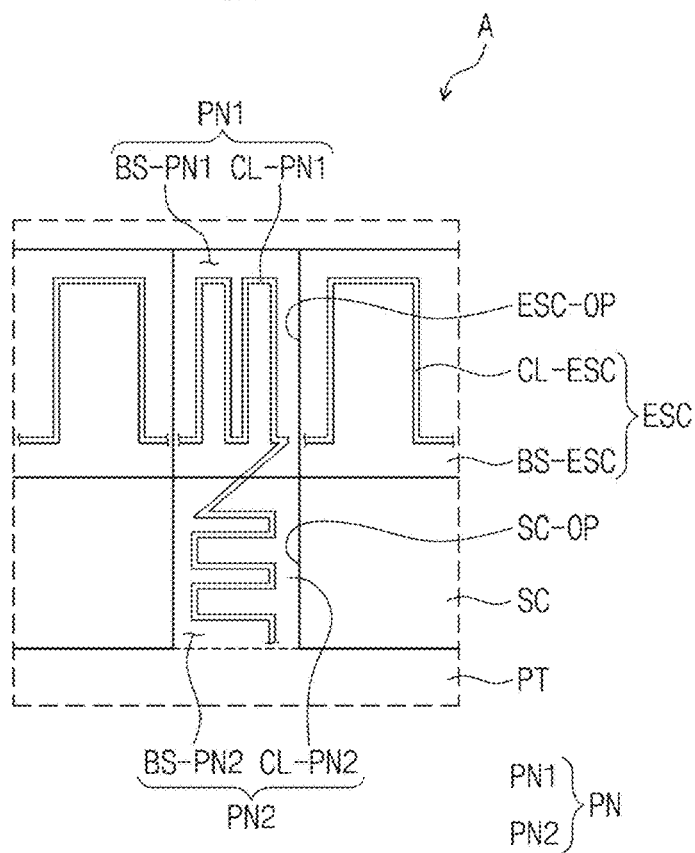
Figure 8:
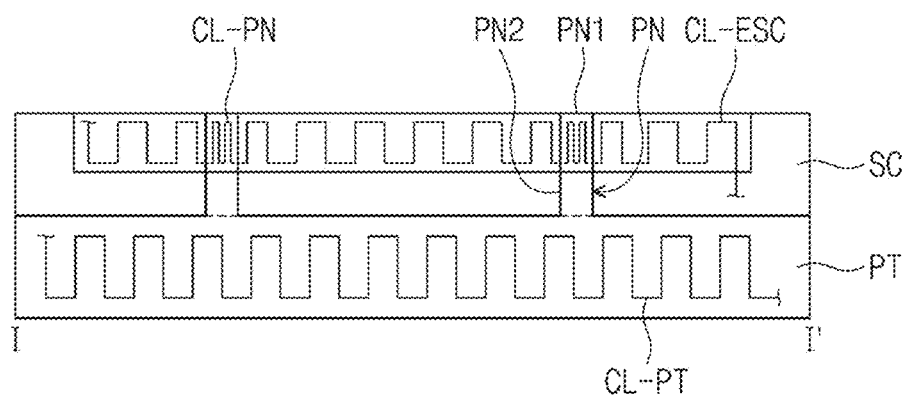
FIG. 8 is a cross-sectional view showing a deposition apparatus according to another embodiment of the present disclosure.

FIG. 5 is a cross-sectional view showing a deposition apparatus according to an embodiment of the present disclosure. FIGS. 6 and 7 are cross-sectional views showing a portion of a deposition apparatus according to embodiments of the present disclosure. FIG. 8 is a cross-sectional view showing a deposition apparatus according to another embodiment of the present disclosure. FIG. 5 is a cross-sectional view taken along line I-I' of FIG. 2. FIGS. 6 and 7 are enlarged views showing an area A of FIG. 5. FIG. 8 is a cross-sectional view taken along line I-I' of FIG. 2.

Referring to FIGS. 2, 5, and 6, the pins PN may protrude from the plate PT, and the susceptor SC and the electrostatic chuck ESC may be coupled to each other by the pins PN in the deposition apparatus. A pin cooler CL-PN may be disposed in at least some of the pins PN. For example, the pin cooler CL-PN may be disposed in a first portion PN1. As another way, the pin cooler CL-PN may be disposed in each of the first portion PN1 and a second portion PN2.

Each of the pins PN may include the first portion PN1 and the second portion PN2. The first portion PN1 may overlap the electrostatic chuck ESC in a cross-sectional view, and the second portion PN2 may overlap the susceptor SC in the cross-sectional view. The first portion PN1 may overlap the electrostatic chuck ESC in any direction between the first direction DR1 and the second direction DR2 (refer to FIG. 2), and the second portion PN2 may overlap the susceptor SC in any direction between the first direction DR1 and the second direction DR2. That is, the first portion PN1 may be disposed in the electrostatic chuck hole ESC-OP defined through the electrostatic chuck ESC, and the second portion PN2 may be disposed in the susceptor hole SC—OP defined through the susceptor SC.

An electrostatic chuck cooler CL-ESC may be disposed in the electrostatic chuck ESC. The electrostatic chuck cooler CL-ESC may be disposed in an electrostatic chuck base portion BS-ESC. The electrostatic chuck cooler CL-ESC may be a cooling line that provides a path through which a cooling material circulates. The electrostatic chuck cooler CL-ESC may include, for example, a cooling line and a refrigerant or a cooling gas circulating through the cooling line. The electrostatic chuck cooler CL-ESC may be a cooling line through which a solvent such as a Galden solution or a cooling gas such as an argon gas or a hydrogen gas circulates. The electrostatic chuck cooler CL-ESC may be disposed in the chuck body BS (refer to FIG. 4) of the electrostatic chuck ESC.

A first cooler CL-PN1 of the pin cooler CL-PN may be disposed in the first portion PN1 of the pins PN. The first portion PN1 may include a first base portion BS-PN1, and the first cooler CL-PN1 may be disposed in the first base portion BS-PN1.

The first cooler CL-PN1 may be a cooling line through which a cooling material circulates. The first cooler CL-PN1 may include, for example, a cooling line and a refrigerant or a cooling gas circulating through the cooling line. The first cooler CL-PN1 may be a cooling line through which a solvent such as a Galden solution or a cooling gas, such as an argon gas or a hydrogen gas, circulates.

The first cooler CL-PN1 and the electrostatic chuck cooler CL-ESC may be independently driven. That is, a driver that drives the first cooler CL-PN1 and a driver that drives the electrostatic chuck cooler CL-ESC may be provided separately from each other. The first cooler CL-PN1 and the electrostatic chuck cooler CL-ESC may be independently driven, and thus, the temperature of the pins PN and the temperature of the electrostatic chuck ESC may be independently controlled, however, the invention should not be limited thereto or thereby. The first cooler CL-PN1 and the electrostatic chuck cooler CL-ESC may be driven by one driver in another embodiment.

The second portion PN2 of the pins PN may include or be made of substantially the same material as that of the plate PT. For example, the second portion PN2 may include or be made of a ceramic or metal material. The second portion PN2 may be provided integrally with the plate PT. That is, the second portion PN2 may extend upward from the upper surface of the plate PT.

The deposition apparatus may include the pins PN that fix the susceptor SC and the electrostatic chuck ESC and are used to load and unload the substrate SUB, and each of the pins PN may include the first portion PN1 including the first cooler CL-PN1 disposed therein and the second portion PN2 including the same material as that of the plate PT. Accordingly, a difference in temperature between an area in which the electrostatic chuck ESC is disposed and an area in which the pins PN are disposed may be effectively prevented from occurring, and thus, a stain may be effectively prevented from occurring in the layer formed through the deposition process.

In a conventional deposition apparatus, a cooler is disposed in an electrostatic chuck to control a temperature in the deposition process and to lower a temperature applied to a target substrate. However, the cooler is not provided in an area around an electrostatic chuck hole portion in which a plurality of pins is defined, and as a result, a temperature in the electrostatic chuck hole portion is higher than that of the other portions. In addition, the stain occurs in the target substrate due to the temperature difference. According to the deposition apparatus of the present disclosure, the temperature of the electrostatic chuck hole ESC-OP in which the pins PN are disposed may be controlled by the first cooler CL-PN1 disposed in the first portion PN1 of the pins PN, and the stain may be effectively prevented from occurring in the target substrate. Accordingly, a product reliability of the display panel manufactured using the deposition apparatus may be improved.

Referring to FIGS. 2, 5, and 7, a cooler may be disposed in the second portion PN2 of the pins PN. The second portion PN2 may include a second base portion BS-PN2, and a second cooler CL-PN2 of the pin cooler CL-PN may be disposed in the second base portion BS-PN2. The second cooler CL-PN2 may be a cooling line providing a path through which a cooling material circulates. The second cooler CL-PN2 may include, for example, a cooling line and a refrigerant or a cooling gas circulating through the cooling line. The second cooler CL-PN2 may be a cooling line through which a solvent such as the Galden solution or a cooling gas, such as an argon gas or a hydrogen gas, circulates. As shown in FIG. 7, the first cooler CL-PN1 may be provided integrally with the second cooler CL-PN2. The first cooler CL-PN1 and the second cooler CL-PN2 may be connected to each other, and the first cooler CL-PN1 may extend from the second cooler CL-PN2, however, the invention should not be limited thereto or thereby. That is, the first cooler CL-PN1 and the second cooler CL-PN2 may be disposed in the first base portion BS-PN1 and the second base portion BS-PN2, respectively, and may be spaced apart from each other without being connected to each other in another embodiment.

Referring to FIG. 8, the deposition apparatus may further include a plate cooler CL-PT disposed in the plate PT. The plate cooler CL-PT may be a cooling line providing a path through which a cooling material circulates. The plate cooler CL-PT may lower the temperature of the plate PT and may control the temperature of the deposition apparatus not to rise excessively in the deposition process. The plate cooler CL-PT may include, for example, a cooling line and a refrigerant or a cooling gas circulating through the cooling line. The plate cooler CL-PT may be a cooling line through which a solvent such as the Galden solution or a cooling gas, such as an argon gas or a hydrogen gas, circulates. The plate cooler CL-PT may be independently driven from the pin cooler CL-PN and the electrostatic chuck cooler CL-ESC. As another way, the plate cooler CL-PT may be driven together with at least one of the pin cooler CL-PN and the electrostatic chuck cooler CL-ESC by the same driver.

Figure 9:
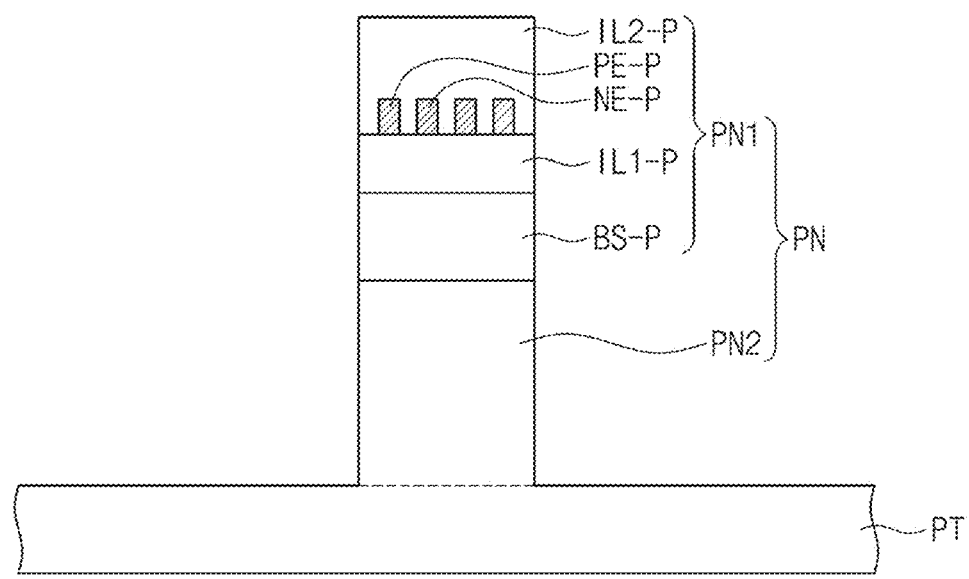
FIG. 9 is a cross-sectional view showing a portion of a deposition apparatus according to an embodiment of the present disclosure.

FIG. 9 is a cross-sectional view showing a portion of the deposition apparatus according to an embodiment of the present disclosure. FIG. 9 shows a portion of the plate PT and one of the pins PN protruding from the upper surface of the plate PT.

Referring to FIG. 9, in the deposition apparatus according to an embodiment, the pin PN protruding from the plate PT may include the first portion PN1 and the second portion PN2, and the first portion PN1 may include a pin body portion BS-P, a plurality of pin insulating layers IL1-P and IL2-P, and a plurality of pin electrodes PE-P and NE-P.

The pin body portion BS-P may include or be made of a material having a predetermined strength. The pin body portion BS-P may include or be made of a ceramic material. However, this is merely one example, and the material for the pin body portion BS-P according to the invention should not be limited thereto or thereby. As an example, the pin body portion BS-P may include or be made of aluminum (Al), titanium (Ti), stainless steel, alumina ($Al_2O_3$), yttrium oxide ($Y_2O_3$), or aluminum nitride in another embodiment. FIG. 9 shows a structure in which the pin body portion BS-P is disposed under a first pin insulating layer IL1-P, however, the invention should not be limited thereto or thereby. That is, the pin body portion BS-P may be disposed over the second pin insulating layer IL2-P in another embodiment. The pin body portion BS-P may correspond to the chuck body BS (refer to FIG. 4) of the electrostatic chuck ESC (refer to FIG. 4). According to an embodiment, the first cooler CL-PN1 (refer to FIG. 6) disposed in the first portion PN1 may be disposed in the pin body portion BS-P.

The first pin insulating layer IL1-P may be disposed on the pin body portion BS-P. The first pin insulating layer IL1-P may include or be made of a material having higher heat resistance and higher chemical stability than those of the second pin insulating layer IL2-P. For example, the first pin insulating layer IL1-P may include yttrium oxide ($Y_2O_3$), however, this is merely one example. That is, the material for the first pin insulating layer IL1-P according to the invention should not be limited thereto or thereby and may include or be made of a variety of materials with the heat resistance and chemical stability. The first pin insulating layer IL1-P may correspond to the first insulating layer IL1 (refer to FIG. 4) of the electrostatic chuck ESC (refer to FIG. 4).

The second pin insulating layer IL2-P may be disposed on the first pin insulating layer IL1-P. The second pin insulating layer IL2-P may include or be made of a material having higher thermal conductivity and higher dielectric characteristics than those of the first pin insulating layer IL1-P. For example, the second pin insulating layer IL2-P may include or be made of alumina ($Al_2O_3$), however, this is merely one example. That is, the material for the second pin insulating layer IL2-P according to the invention should not be limited thereto or thereby, and the second pin insulating layer IL2-P may include or be made of a variety of materials having the thermal conductivity. The second pin insulating layer IL2-P may correspond to the second insulating layer IL2 (refer to FIG. 4) of the electrostatic chuck ESC (refer to FIG. 4).

The pin electrodes PE-P and NE-P may be disposed between the first pin insulating layer IL1-P and the second pin insulating layer IL2-P. The pin electrodes PE-P and NE-P may include a plurality of positive pin electrodes PE-P and a plurality of negative pin electrodes NE-P. The positive pin electrodes PE-P and the negative pin electrodes NE-P may be disposed between the first pin insulating layer IL1-P and the second pin insulating layer IL2-P. The second pin insulating layer IL2-P may cover the positive pin electrodes PE-P and the negative pin electrodes NE-P. The positive pin electrodes PE-P and the negative pin electrodes NE-P may have different polarities from each other. The positive pin electrodes PE-P may be alternately arranged with the negative pin electrodes NE-P.

Each of the positive pin electrodes PE-P and the negative pin electrodes NE-P may include or be made of tungsten (W). However, this is merely one example, and a material for the positive pin electrodes PE-P and a material for the negative pin electrodes NE-P according to the invention should not be limited thereto or thereby. For example, each of the positive pin electrodes PE-P and the negative pin electrodes NE-P may include or be made of silver (Ag) or copper (Cu) in another embodiment.

A positive direct-current voltage may be applied to the positive pin electrodes PE-P. A first electrostatic force may be generated between the positive pin electrodes PE-P and the substrate SUB. A negative direct-current voltage may be applied to the negative pin electrodes NE-P. A second electrostatic force may be generated between the negative pin electrodes NE-P and the substrate SUB. The first electrostatic force and the second electrostatic force may be an electrostatic force. According to an embodiment, the first portion PN1 may be a bipolar electrostatic chuck, however, this is merely one example, and the first portion PN1 according to the invention should not be limited thereto or thereby. For example, the first portion PN1 may be a monopolar electrostatic chuck in another embodiment. In this case, the direct-current voltage applied to the positive pin electrodes PE-P of the first portion PN1 and the direct-current voltage applied to the negative pin electrodes NE-P of the first portion PN1 may have the same polarity as each other.

In a case where the positive direct-current voltage is applied to the positive pin electrodes PE-P, upper portions in a first pin area of the substrate SUB, which overlap the positive pin electrodes PE-P, respectively, when viewed in a plane (i.e., in a plan view), may be charged with a negative potential. The electrostatic force may be generated between the positive pin electrodes PE-P and the first pin area due to electric charges.

In a case where the negative direct-current voltage is applied to the negative pin electrodes NE-P, upper portions in a second pin area of the substrate SUB, which overlap the negative pin electrodes NE-P, respectively, when viewed in a plane (i.e., in a plan view), may be charged with a positive potential. The electrostatic force may be generated between the negative pin electrodes NE-P and the second pin area due to electric charges.

The pin electrodes PE-P and NE-P disposed in the pins PN may be independently driven from the electrodes PE and NE (refer to FIG. 4) disposed in the electrostatic chuck ESC (refer to FIG. 4). That is, a driver to drive the pin electrodes PE-P and NE-P and a driver to drive the electrodes PE and NE may be provided separately from each other. As the pin electrodes PE-P and NE-P may be independently driven from the electrodes PE and NE, the electrostatic force of the portions of the pins PN and the electrostatic force of the portions of the electrostatic chuck ESC may be independently controlled, however, the invention should not be limited thereto or thereby. As another way, the pin electrodes PE-P and NE-P and the electrodes PE and NE may be driven together with each other by one driver.

Figure 10:
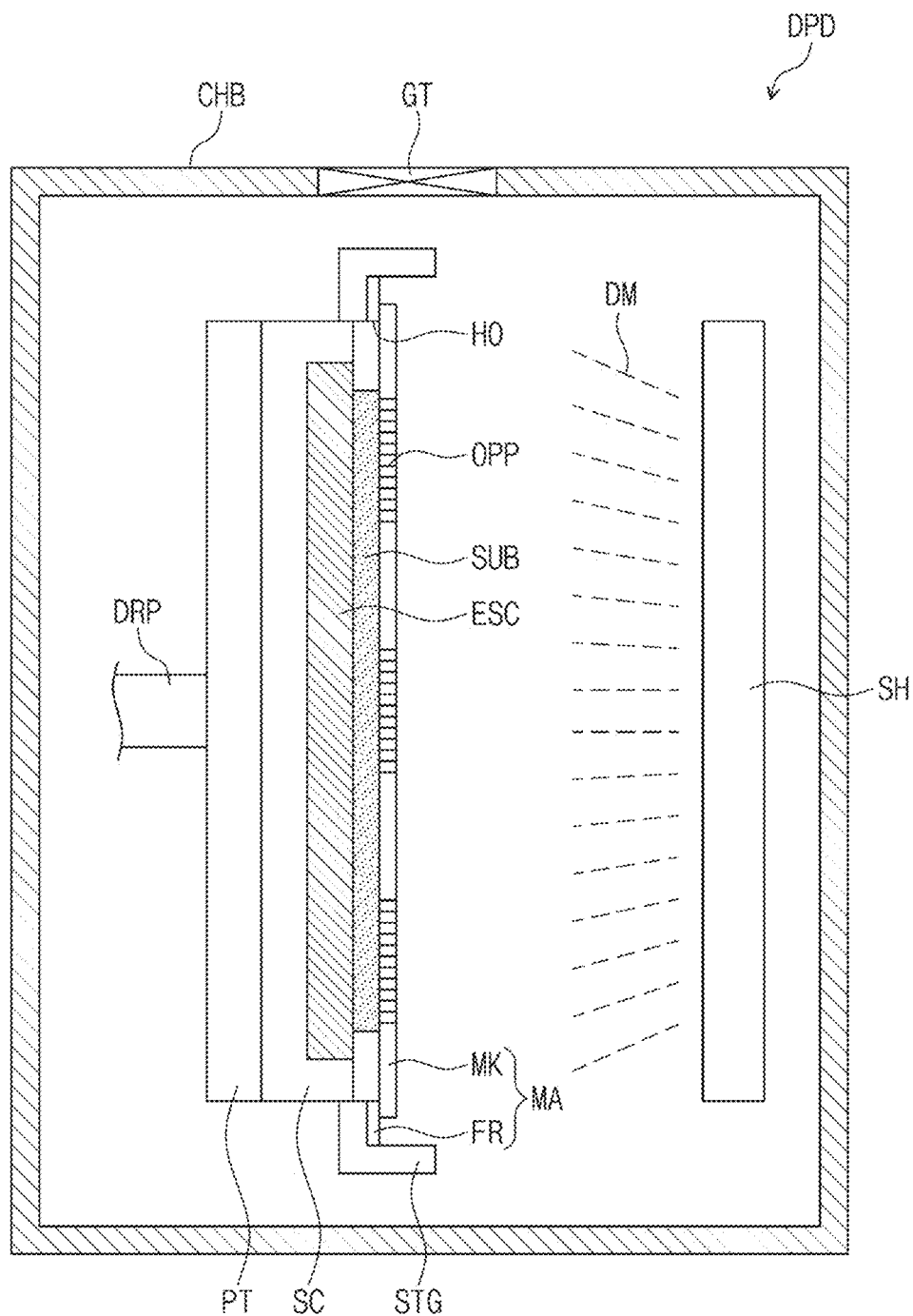
FIG. 10 is a plan view showing a display panel manufacturing apparatus according to an embodiment of the present disclosure.
Figure 11:
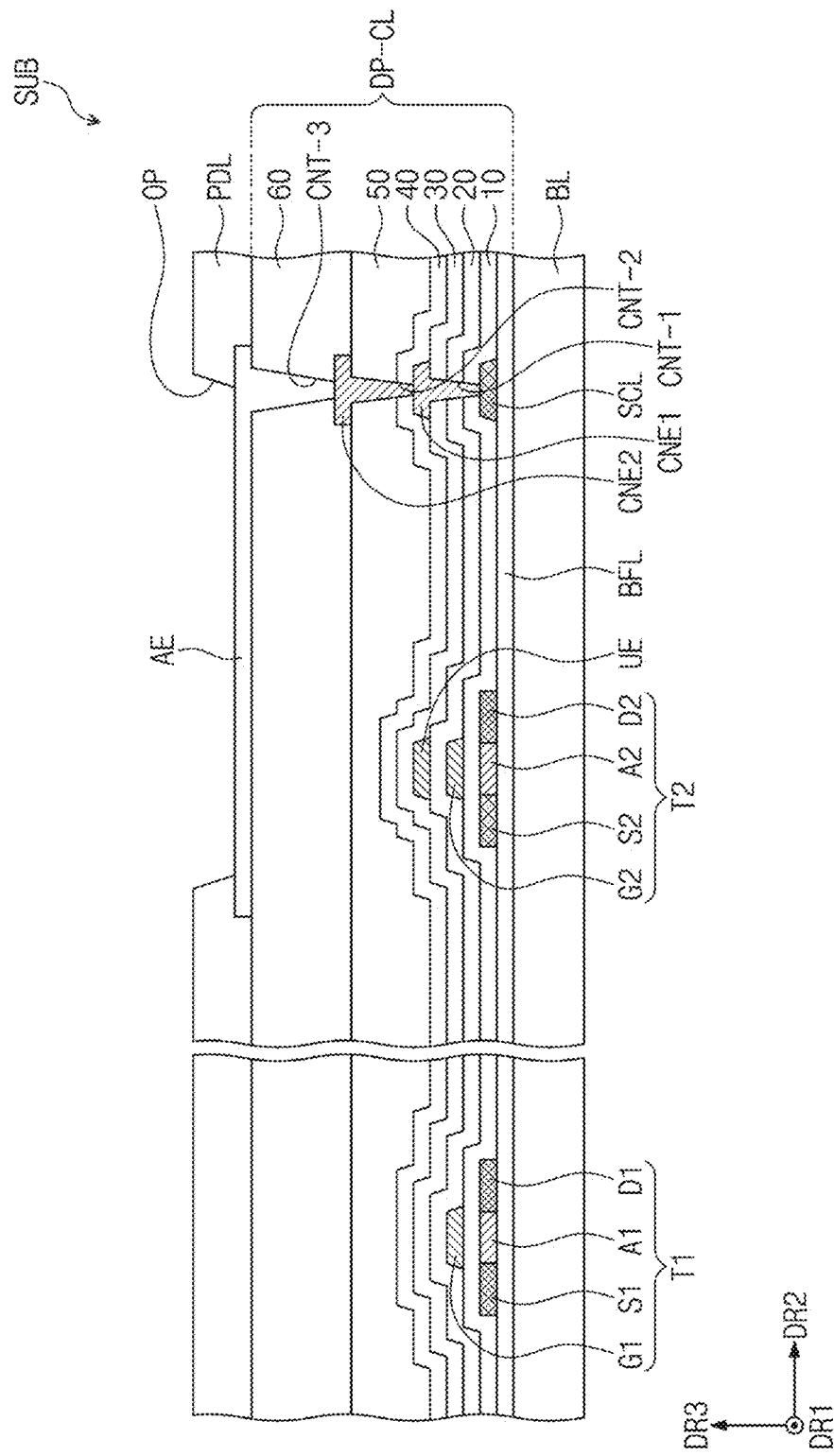
FIG. 11 is a cross-sectional view showing a target substrate processed by a display panel manufacturing apparatus according to an embodiment of the present disclosure.

FIG. 10 is a plan view showing a display panel manufacturing apparatus DPD according to an embodiment of the present disclosure. FIG. 11 is a cross-sectional view showing a target substrate SUB processed by the display panel manufacturing apparatus DPD according to an embodiment of the present disclosure.

Referring to FIG. 10, the display panel manufacturing apparatus DPD may include a chamber CHB, a deposition head SH, a stage STG, a mask assembly MA, and a support member. The support member may include the plate PT, the susceptor SC, and the electrostatic chuck ESC. The support member may further include the driver DRP connected to the plate PT.

The chamber CHB may provide a sealed space. The deposition head SH, the stage STG, the mask assembly MA, the electrostatic chuck ESC, and the driver DRP may be disposed in the chamber CHB. The chamber CHB may include at least one gate GT. The chamber CHB may be opened or closed by the gate GT. The substrate SUB may be loaded or unloaded through the gate GT provided in the chamber CHB. Although not shown, a temperature control module for controlling the temperature of the stage STG and the electrostatic chuck ESC may be disposed in the chamber CHB.

The deposition head SH may spray a deposition material DM. According to an embodiment, the deposition head SH may be a shower head. The deposition material DM may be a material that is sublimatable or vaporizable and may include or be made of at least one of an inorganic material, a metal material, and an organic material. The deposition material DM according to the present embodiment will be described as including an organic material used to manufacture an organic light emitting layer.

The stage STG may vertically move the mask assembly MA. The mask assembly MA may be placed on the stage STG. The mask assembly MA may face the deposition head SH. The stage STG may be disposed to overlap a frame FR of the mask assembly MA in a plan view, and thus, may support the mask assembly MA.

The stage STG may not overlap an opening HO of the frame FR in a plan view. That is, the stage STG may be disposed outside a movement path of the deposition material supplied to the substrate SUB from the deposition head SH.

The substrate SUB may be disposed under the mask assembly MA. The deposition material DM may be deposited on the substrate SUB via a plurality of penetration portions OPP.

The substrate SUB may be processed while being chucked by the electrostatic chuck ESC disposed at an uppermost position of the support member. According to an embodiment, the deposition process may be performed on the substrate SUB after the substrate SUB is chucked such that the upper surface of the substrate SUB forms an angle of about 90 degrees with respect to a ground, however, the invention should not be limited thereto or thereby. That is, a direction to which the upper surface of the electrostatic chuck ESC faces and a direction to which the substrate SUB chucked by the electrostatic chuck ESC faces may be changed by the drive of the driver DRP. The substrate SUB may be disposed under the mask assembly MA by the driver DRP.

The substrate SUB may include or be made of a conductive material. For example, the substrate SUB may include a circuit element layer. The circuit element layer may include a conductive layer having a conductivity.

Referring to FIG. 11, the substrate SUB may be a portion of an organic light emitting panel including organic light emitting elements.

The substrate SUB may include a surface substantially parallel to a surface defined by the first direction DR1 and the second direction DR2. A third direction DR3 may indicate a thickness direction of the substrate SUB. Front (or upper) and rear (or lower) surfaces of the substrate SUB may be distinguished by the third direction DR3. The third direction DR3 may cross the first direction DR1 and the second direction DR2. For example, the first direction DR1, the second direction DR2, and the third direction DR3 may be substantially perpendicular to each other. In the present disclosure, the surface defined by the first direction DR1 and the second direction DR2 may be defined as a plane, and the expression "when viewed in a plane" may mean a state of being viewed in the third direction DR3.

The substrate SUB may include a base layer BL, a circuit layer DP-CL, an electrode AE, and a pixel definition layer PDL.

The base layer BL may include or be made of a synthetic resin film. The base layer BL may have a multi-layer structure. For instance, the base layer BL may have a three-layer structure of a synthetic resin layer, an adhesive layer, and a synthetic resin layer. The synthetic resin layer may be a polyimide-based resin layer, however, the material for the synthetic resin layer should not be particularly limited. The synthetic resin layer may include or be made of at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

At least one inorganic layer may be formed on an upper surface of the base layer BL. The inorganic layer may include or be made of at least one of aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer. In the present embodiment, the substrate SUB may include a buffer layer BFL.

The circuit layer DP-CL may include the buffer layer BFL, a first transistor T1, a second transistor T2, a first insulating layer 10, a second insulating layer 20, a third insulating layer 30, a fourth insulating layer 40, a fifth insulating layer 50, and a sixth insulating layer 60.

The buffer layer BFL may increase an adhesion between the base layer BL and a semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include or be made of polysilicon, however, this is merely one example, and the material for the semiconductor pattern according to the invention should not be limited thereto or thereby. As another example, the semiconductor pattern may include or be made of amorphous silicon or metal oxide.

The semiconductor pattern may have different electrical properties depending on whether it is doped or not and whether it is doped with an N-type dopant or a P-type dopant. The semiconductor pattern may include a doped region and a non-doped region. The doped region may be doped with the N-type dopant or the P-type dopant. An N-type transistor may include a doped region doped with the N-type dopant. A P-type transistor may include a doped region doped with the P-type dopant.

The doped region may have a conductivity greater than that of the non-doped region and may substantially serve as an electrode or signal line. The non-doped region may substantially correspond to an active (or a channel) of a transistor. In other words, a portion of the semiconductor pattern may be the active of the transistor, another portion of the semiconductor pattern may be a source or a drain of the transistor, and the other portion of the semiconductor pattern may be a connection electrode or a connection signal line.

The transistor may include the first transistor T1 and the second transistor T2. A source S1, an active A1, and a drain D1 of the first transistor T1 may be formed from the semiconductor pattern, and a source S2, an active A2, and a drain D2 of the second transistor T2 may be formed from the semiconductor pattern. The source S1 and the drain D1 may extend in opposite directions to each other from the active A1, and the source S2 and the drain D2 may extend in opposite directions to each other from the active A2.

In FIG. 11, a portion of a connection signal line SCL formed from the semiconductor pattern is shown. Although not shown in figures, the connection signal lines SCL may be connected to the drain D2 of the second transistor T2 when viewed in a plane.

The first insulating layer 10 may be disposed on the buffer layer BFL. The first insulating layer 10 may cover the first transistor T1 and the second transistor T2. The first insulating layer 10 may be an inorganic layer and/or an organic layer and may have a single-layer or multi-layer structure. Not only the first insulating layer 10, but also an insulating layer of the circuit layer DP-CL described later may be an inorganic layer and/or an organic layer and may have a single-layer or multi-layer structure.

Gates G1 and G2 may be disposed on the first insulating layer 10. The gates G1 and G2 may be portions of a metal pattern. When viewed in a plane, the gates G1 and G2 may overlap the actives A1 and A2, respectively, in a plan view.

The second insulating layer 20 may be disposed on the first insulating layer 10. The second insulating layer 20 may cover the gates G1 and G2.

An upper electrode UE may be disposed on the second insulating layer 20. When viewed in a plane, the upper electrode UE may overlap the gate G2 of the second transistor T2 in a plan view. The upper electrode UE may be a portion of the metal pattern. The portion of the gate G2 and the upper electrode UE overlapping the portion of the gate G2 in a plan view may define a capacitor, however, this is merely one example. According to an embodiment, the upper electrode UE may be omitted.

The third insulating layer 30 may be disposed on the second insulating layer 20. The third insulating layer 30 may cover the upper electrode UE. A first connection electrode CNE1 may be disposed on the third insulating layer 30. The first connection electrode CNE1 may be connected to the connection signal line SCL via a contact hole CNT-1 defined through the first insulating layer 10, the second insulating layer 20, and the third insulating layer 30.

The fourth insulating layer 40 may be disposed on the third insulating layer 30. The fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

The sixth insulating layer 60 may be disposed on the fifth insulating layer 50. The sixth insulating layer 60 may cover the second connection electrode CNE2. The sixth insulating layer 60 may be an organic layer.

The electrode AE may be disposed on the sixth insulating layer 60. The electrode AE may be connected to the second connection electrode CNE2 via a contact hole CNT-3 defined through the sixth insulating layer 60.

The pixel definition layer PDL may be disposed on the electrode AE and the sixth insulating layer 60. The pixel definition layer PDL may be provided with an opening OP defined therethrough. At least a portion of the electrode AE may be exposed through the opening OP of the pixel definition layer PDL.

The deposition material may be deposited on the electrode AE of the substrate SUB to form the light emitting layer. However, the invention should not be limited thereto or thereby. The layer formed by the deposition material should not be particularly limited as long as the layer may be formed by the deposition process such as a sputtering process. As an example, the deposition material may be deposited on the electrode AE to form an electric charge transport layer such as a hole transport layer or an electron transport layer, or the deposition material may include or be made of a metal material to form the upper electrode on the organic layer such as the light emitting layer. As another way, the deposition material may include an or be made of organic material or an inorganic material and may form a capping layer or a thin film encapsulation layer on the upper electrode.

Figure 12A:
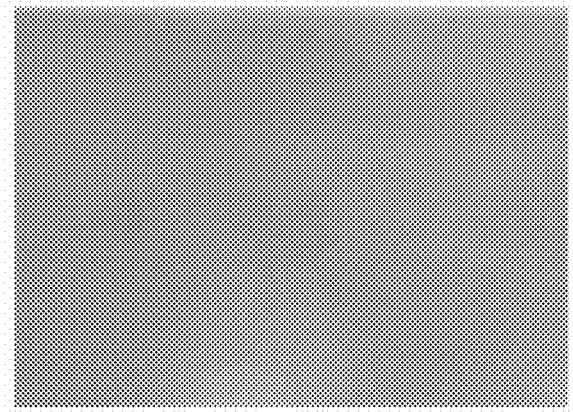
FIG. 12A is a SEM image showing a thin film manufactured by a deposition apparatus according to an embodiment of the present disclosure.
Figure 12B:
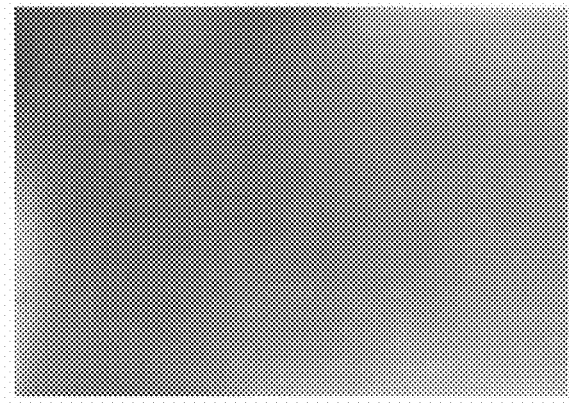
FIG. 12B is a SEM image showing a thin film manufactured by a deposition apparatus according to a comparison example.

FIG. 12A is a SEM image showing a thin film manufactured by a deposition apparatus according to an embodiment of the present disclosure, and FIG. 12B is a SEM image showing a thin film manufactured by a deposition apparatus according to a comparison example. FIG. 12A is the SEM image showing the thin film manufactured by the deposition apparatus in which the first cooler is disposed in the first portion corresponding to the upper portion of the pins and overlapping the electrostatic chuck in a cross-section as the embodiment of the present disclosure. Different from the present disclosure, FIG. 12B is the SEM image showing the thin film manufactured by the deposition apparatus in which the cooler is not disposed in the pins. FIGS. 12A and 12B are the SEM images showing upper surfaces of titanium (T1) thin films manufactured by the deposition apparatuses according to the embodiment example and the comparison example.

Referring to FIGS. 12A and 12B, in the metal thin film manufactured by the deposition apparatus according to the embodiment of the present disclosure, it may be observed that the metal thin film is uniformly formed without the stains on the upper surface of the thin film. On the other hand, in the metal thin film manufactured by the deposition apparatus according to the comparison example, it may be observed that the stains occur on the upper surface of the metal thin film due to unevenness in temperature. According to an embodiment, the deposition apparatus may include the cooler at the upper portion of the pins provided in the electrostatic chuck hole in addition to the cooler disposed in the electrostatic chuck, and thus, the temperature at the upper portion of the deposition apparatus may be uniformly maintained. Accordingly, the defects such as the stains may be effectively prevented from occurring in the thin film manufactured by the deposition apparatus. As a result, the reliability of the display panel manufactured by the deposition apparatus may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A deposition apparatus comprising:
 a susceptor provided with a plurality of susceptor holes defined therein;
 an electrostatic chuck disposed on the susceptor and provided with a plurality of electrostatic chuck holes defined therein; and
 a plurality of pins penetrating through an entirety of both the susceptor and the electrostatic chuck to connect the susceptor and the electrostatic chuck, each of the pins comprising:
 a first portion disposed in a corresponding electrostatic chuck hole of the plurality of electrostatic chuck holes; and a second portion disposed in a corresponding susceptor hole of the plurality of susceptor holes, the first portion comprising:
a first base portion;
a first cooler disposed in the first base portion;
a plurality of pin insulating layers; and
a plurality of pin electrodes disposed between the pin insulating layers, wherein the plurality of pins are driven.

2. The deposition apparatus of claim 1, wherein the second portion comprises:
a second base portion; and
a second cooler disposed in the second base portion.

3. The deposition apparatus of claim 1, wherein the electrostatic chuck comprises:
a chuck body;
a first insulating layer disposed on the chuck body;
a plurality of electrodes disposed on the first insulating layer; and
a second insulating layer disposed on the electrodes.

4. The deposition apparatus of claim 1, wherein the pin electrodes are independently driven from the electrodes of the electrostatic chuck.

5. The deposition apparatus of claim 1, wherein the second portion comprises a ceramic material or a metal material.

6. The deposition apparatus of claim 1, further comprising a plate disposed under the susceptor and spaced apart from the electrostatic chuck with the susceptor interposed therebetween, wherein the pins are protruded from an upper surface of the plate.

7. The deposition apparatus of claim 6, wherein the plate comprises a plate cooler disposed in the plate.

8. The deposition apparatus of claim 6, further comprising a driver disposed under the plate to change an angle of the plate, the susceptor, and the electrostatic chuck.

9. The deposition apparatus of claim 1, wherein the susceptor comprises:
a susceptor body; and
a heater disposed in the susceptor body.

10. The deposition apparatus of claim 1, wherein the electrostatic chuck comprises:
an electrostatic chuck base portion; and
an electrostatic chuck cooler disposed in the electrostatic chuck base portion.

11. The deposition apparatus of claim 10, wherein the first cooler and the electrostatic cooler are independently driven from each other.

12. The deposition apparatus of claim 1, wherein the first cooler comprises:
a cooling line; and
a refrigerant which circulates through the cooling line.

13. A deposition apparatus comprising:
a plate comprising a plurality of pins protruding toward an upper direction;
a susceptor disposed on the plate and an entire thickness thereof penetrated by each of the pins; and
an electrostatic chuck disposed on the susceptor and an entire thickness thereof penetrated by each of the pins, each of the pins comprising:
a first base portion; and
a first cooler disposed in the first base portion,
wherein the first base portion comprises:
a plurality of pin insulating layers;
a plurality of pin electrodes disposed between the pin insulating layers;
a plurality of pin insulating layers; and
a plurality of pin electrodes disposed between the pin insulating layers, wherein the plurality of pins are driven.

14. The deposition apparatus of claim 13, wherein the first base portion and the first cooler overlap the electrostatic chuck in a direction crossing the upper direction.

15. The deposition apparatus of claim 13, wherein the electrostatic chuck is provided with electrostatic chuck holes defined therein, the pins are disposed in the electrostatic chuck holes, and the first base portion and the first cooler are disposed in the electrostatic chuck holes.

16. A display panel manufacturing apparatus comprising:
a chamber;
a deposition head disposed in the chamber and which sprays a deposition material; and
a support member disposed under the deposition head and which supports a target substrate, the support member comprising:
a susceptor provided with a plurality of susceptor holes defined therein;
an electrostatic chuck disposed on the susceptor and provided with a plurality of electrostatic chuck holes defined therein; and
a plurality of pins penetrating through an entirety of both the susceptor and the electrostatic chuck to connect the susceptor and the electrostatic chuck,
wherein each of the pins comprises:
a first portion disposed in a corresponding electrostatic chuck hole of the plurality of electrostatic chuck holes; and
a second portion disposed in a corresponding susceptor hole of the plurality of susceptor holes,
wherein the first portion comprises:
a first base portion;
a first cooler disposed in the first base portion;
a plurality of pin insulating layers; and
a plurality of pin electrodes disposed between the pin insulating layers, wherein the plurality of pins are driven.

17. The display panel manufacturing apparatus of claim 16, further comprising a mask disposed between the support member and the deposition head.

18. The display panel manufacturing apparatus of claim 16, wherein the target substrate is disposed on and supported by the electrostatic chuck, and the support member further comprises a driver to control the target substrate to be inclined while being chucked at a predetermined angle.

19. The display panel manufacturing apparatus of claim 16, wherein the support member further comprises a plate disposed under the susceptor and spaced apart from the electrostatic chuck with the susceptor interposed therebetween, and the pins are protruded from an upper surface of the plate.

* * * * *